(12) United States Patent
Hu

(10) Patent No.: US 9,741,645 B2
(45) Date of Patent: Aug. 22, 2017

(54) DENSE INTERCONNECT WITH SOLDER CAP (DISC) FORMATION WITH LASER ABLATION AND RESULTING SEMICONDUCTOR STRUCTURES AND PACKAGES

(75) Inventor: Chuan Hu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/995,629

(22) PCT Filed: Dec. 21, 2011

(86) PCT No.: PCT/US2011/066542
§ 371 (c)(1),
(2), (4) Date: Jun. 19, 2013

(87) PCT Pub. No.: WO2013/095442
PCT Pub. Date: Jun. 27, 2013

(65) Prior Publication Data
US 2014/0035134 A1    Feb. 6, 2014

(51) Int. Cl.
*H01L 23/02*    (2006.01)
*H01L 23/498*   (2006.01)
(Continued)

(52) U.S. Cl.
CPC .. *H01L 23/49811* (2013.01); *H01L 21/76885* (2013.01); *H01L 23/49816* (2013.01); *H01L 23/5389* (2013.01); *H01L 24/11* (2013.01); *H01L 24/19* (2013.01); *H01L 24/20* (2013.01); *H01L 24/96* (2013.01); *H01L 24/97* (2013.01); *H01L 24/05* (2013.01); *H01L 24/13* (2013.01);
(Continued)

(58) Field of Classification Search
CPC ............................ H01L 21/56; H01L 21/6835
USPC .......................................................... 257/737
See application file for complete search history.

(56) References Cited

U.S. PATENT DOCUMENTS 6,753,600 B1 * 6/2004 Ho .................. H01L 23/3128
                                                        257/687
7,479,447 B2 * 1/2009 Daubenspeck et al. ...... 438/601
(Continued)

FOREIGN PATENT DOCUMENTS

JP            11297890         10/1999

OTHER PUBLICATIONS

International Search Report and Written Opinion for PCT Patent Application No. PCT/US2011/066542 Mailed Nov. 9, 2012, 12 Pages.
(Continued)

*Primary Examiner* — Telly Green
(74) *Attorney, Agent, or Firm* — Schwabe, Williamson & Wyatt, P.C.

(57) ABSTRACT

Dense interconnect with solder cap (DISC) formation with laser ablation and resulting semiconductor structures and packages are described. For example, a method of fabricating a semiconductor structure includes forming an insulative material stack above a plurality of solder bump landing pads. The solder bump landing pads are above an active side of a semiconductor die. A plurality of trenches is formed in the insulative material stack by laser ablation to expose a corresponding portion of each of the plurality of solder bump landing pads. A solder bump is formed in each of the plurality of trenches. A portion of the insulative material stack is then removed.

18 Claims, 3 Drawing Sheets

(51) Int. Cl.
*H01L 21/768* (2006.01)
*H01L 23/00* (2006.01)
*H01L 23/538* (2006.01)

(52) U.S. Cl.
CPC ...... *H01L 24/16* (2013.01); *H01L 2224/0401* (2013.01); *H01L 2224/05647* (2013.01); *H01L 2224/1148* (2013.01); *H01L 2224/11332* (2013.01); *H01L 2224/11474* (2013.01); *H01L 2224/11849* (2013.01); *H01L 2224/12105* (2013.01); *H01L 2224/131* (2013.01); *H01L 2224/133* (2013.01); *H01L 2224/13022* (2013.01); *H01L 2224/13147* (2013.01); *H01L 2224/13294* (2013.01); *H01L 2224/16227* (2013.01); *H01L 2224/97* (2013.01); *H01L 2924/10252* (2013.01); *H01L 2924/10253* (2013.01); *H01L 2924/10271* (2013.01); *H01L 2924/12042* (2013.01); *H01L 2924/14* (2013.01); *H01L 2924/1433* (2013.01); *H01L 2924/1434* (2013.01); *H01L 2924/1461* (2013.01); *H01L 2924/15153* (2013.01); *H01L 2924/18162* (2013.01); *H01L 2924/3511* (2013.01)

(56) References Cited

U.S. PATENT DOCUMENTS

| | | | |
|---|---|---|---|
| 7,517,788 B2 * | 4/2009 | Pang | H01L 24/11 257/E21.508 |
| 7,666,768 B2 * | 2/2010 | Raravikar | H01L 21/76898 438/487 |
| 8,421,245 B2 * | 4/2013 | Gonzalez | H01L 21/568 257/738 |
| 8,754,516 B2 * | 6/2014 | Malatkar | H01L 24/19 257/678 |
| 2002/0130411 A1 | 9/2002 | Cheng et al. | |
| 2003/0184979 A1 * | 10/2003 | Tsai et al. | 361/748 |
| 2004/0256731 A1 | 12/2004 | Mao et al. | |
| 2007/0152313 A1 * | 7/2007 | Periaman | H01L 25/0657 257/686 |
| 2007/0252288 A1 * | 11/2007 | Farooq et al. | 257/778 |
| 2009/0079063 A1 * | 3/2009 | Chrysler | H01L 23/38 257/720 |
| 2009/0283898 A1 * | 11/2009 | Janzen | H01L 21/76898 257/698 |
| 2009/0321947 A1 * | 12/2009 | Pratt | H01L 23/481 257/777 |
| 2010/0096744 A1 * | 4/2010 | Mori | H01L 21/4853 257/698 |
| 2010/0195953 A1 * | 8/2010 | Miyatake et al. | 385/14 |
| 2011/0228464 A1 * | 9/2011 | Guzek | H01L 23/49816 361/679.31 |
| 2012/0049382 A1 * | 3/2012 | Malatkar | H01L 24/19 257/774 |
| 2012/0074581 A1 * | 3/2012 | Guzek et al. | 257/774 |
| 2012/0161316 A1 | 6/2012 | Gonzalez et al. | |
| 2012/0306070 A1 * | 12/2012 | Yew | H01L 24/82 257/737 |
| 2013/0119555 A1 * | 5/2013 | Sundaram et al. | 257/774 |
| 2013/0270715 A1 * | 10/2013 | Malatkar et al. | 257/774 |
| 2013/0284572 A1 * | 10/2013 | Teh | H01L 25/0657 200/283 |
| 2014/0002223 A1 * | 1/2014 | Sainz | H01F 17/0006 336/192 |

OTHER PUBLICATIONS

International Preliminary Report on Patentability from PCT/US2011/066542 mailed Jul. 3, 2014, 8 pgs.

* cited by examiner

DENSE INTERCONNECT WITH SOLDER CAP (DISC) FORMATION WITH LASER ABLATION AND RESULTING SEMICONDUCTOR STRUCTURES AND PACKAGES

CLAIM OF PRIORITY

This application is a U.S. National Phase application under 35 U.S.C. §371 of International Application No. PCT/US2011/066542, filed Dec. 21, 2011, entitled "DENSE INTERCONNECT WITH SOLDER CAP (DISC) FORMATION WITH LASER ABLATION AND RESULTING SEMICONDUCTOR STRUCTURES AND PACKAGES," the entire contents of which are incorporated herein by reference.

TECHNICAL FIELD

Embodiments of the invention are in the field of semiconductor structures and packages and, in particular, dense interconnect with solder cap (DISC) formation with laser ablation and resulting semiconductor structures and packages.

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. For example, some semiconductor packages now use a coreless substrate, which does not include the thick resin core layer commonly found in conventional substrates. Furthermore, the demand for higher performance devices results in a need for an improved semiconductor package that enables a thin packaging profile and low overall warpage compatible with subsequent assembly processing.

A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over—the active side facing down on the mounting area. The solder bumps are used to connect the semiconductor device directly to the substrate.

C4 solder ball connections have been used for many years to provide flip chip interconnections between semiconductor devices and substrates. Hemispherical C4 solder bumps are formed above an insulation layer and above the exposed surfaces of connector pads (also known as bump pads), each of which is exposed through a via hole in the insulation layer or layers. Subsequently, the solder bumps are heated above their melting point until they reflow and form a connection with the Cu stud bumps of the die. The actual C4 solder bumps may be fabricated using a number of different processing techniques, including evaporation, screen printing, and electroplating. Fabrication by electroplating requires a series of basic operations which typically include the deposition of a metallic seed layer, the application of an imaged photo-resist (in the pattern of C4 solder bumps), the electro-deposition of solder, the stripping of the photo-resist, and the sub-etching of the metallic seed layer to isolate the C4 bumps. A semiconductor die with C4 solder ball connections may also be packaged in a Bumpless Build-Up Layer or BBUL processor packaging technology. Such a process is bumpless since it does not use the usual tiny solder bumps to attach the silicon die to the processor package wires. It has build-up layers since it is grown or built-up around the silicon die. Additionally, some semiconductor packages now use a coreless substrate, which does not include the thick resin core layer commonly found in conventional substrates.

As semiconductor structures become more advanced, the need for higher I/O density leads to a tighter C4 bump pitch. This, in turn, puts stringent requirements on the fabrication and dimensions of the line and spacing.

SUMMARY

Embodiments of the present invention include dense interconnect with solder cap (DISC) formation with laser ablation and resulting semiconductor structures and packages.

In an embodiment, a method of fabricating a semiconductor structure includes forming an insulative material stack above a plurality of solder bump landing pads. The solder bump landing pads are above an active side of a semiconductor die. A plurality of trenches is formed in the insulative material stack by laser ablation to expose a corresponding portion of each of the plurality of solder bump landing pads. A solder bump is formed in each of the plurality of trenches. A portion of the insulative material stack is then removed.

In another embodiment, a semiconductor structure includes a semiconductor die having an active side. A photo-insensitive solder mask is disposed on the active side of the semiconductor die. The photo-insensitive solder mask includes a plurality of trenches exposing a corresponding portion of each of a plurality of solder bump landing pads. A solder bump is disposed in each of the plurality of trenches.

In another embodiment, a semiconductor package includes a substrate having a land side. A semiconductor die is embedded in the substrate. The semiconductor die includes an active side proximate to the land side of the substrate. The semiconductor die also includes a photo-insensitive solder mask disposed on the active side of the semiconductor die, between the semiconductor die and the substrate. The photo-insensitive solder mask includes a plurality of trenches exposing a corresponding portion of each of a plurality of solder bump landing pads. The semiconductor die also includes a solder bump disposed in each of the plurality of trenches.

DETAILED DESCRIPTION

Figure 1A:
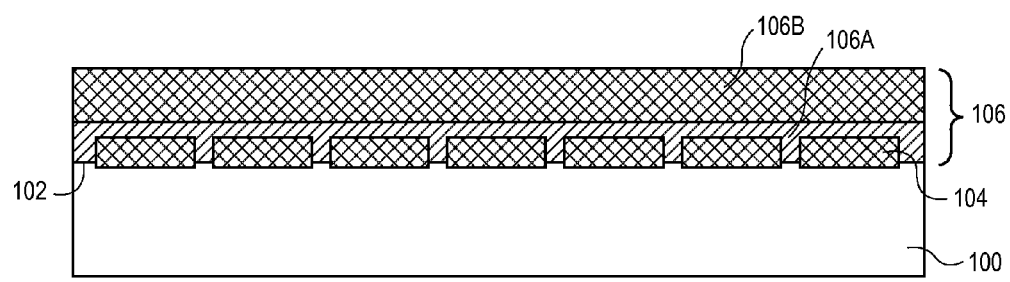
FIG. 1A illustrates a cross-sectional view representing an operation including forming an insulative material stack above a plurality of solder bump landing pads above an active side of a semiconductor die in a method of fabricating a semiconductor structure, in accordance with an embodiment of the present invention.

Dense interconnect with solder cap (DISC) formation with laser ablation and resulting semiconductor structures and packages are described. In the following description, numerous specific details are set forth, such as packaging architectures and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments of the present invention are directed to solder height engineering of dense interconnects with solder cap (DISC). In an embodiment, laser ablation is used to define double layer single patterning to provide trenches for forming solder bumps on a semiconductor die.

DISC packaging may have very broad advantages in solder scaling, reliability, die attachment and other process or structure or material choices. However, one of the main disadvantages of such packaging is the extra cost typically associated with and extra one or two lithography operations typically used to enable such packaging.

As such, in an embodiment, cost of DISC packaging is rendered significantly less expensive by replacing traditional lithography operations using thick photoresist, exposure, and stripping with a single patterning operation. In one such embodiment, control of the height of solder is achieved and broader material selection for wafer level underfill materials is realized. For example, in one embodiment, instead of performing traditional lithography with photosensitive materials, a laser ablation operation with an excimer laser is performed.

The laser ablation may be used to pattern several types of materials (e.g., a material layer that remains permanently and another that is removed) within the same patterning operation. Furthermore in an embodiment, approaches described herein do not require use of a material that is photosensitive. This may greatly reduces the cost of the packaging process and improve the reliability with broader selection in permanent wafer level underfill materials, e.g., a cost savings of approximately 0.2% may be achieved for each wafer. Additionally, such a process may be compatible with low k materials integrated into the back end of the active side of a semiconductor die. Pitch scaling may also be facilitated. For example, in an embodiment, an approximately 90 micron package pitch is achieved with laser ablation for a 10 nanometer node product and may be scalable to, e.g., a 30 micron package pitch.

In an aspect, a method is provided for forming a semiconductor structure, e.g., in preparation for subsequent packaging. For example, FIGS. 1A-1D illustrate cross-sectional views representing various operations in a method of fabricating a semiconductor structure, in accordance with an embodiment of the present invention.

Referring to FIG. 1A, an insulative material stack 106 is formed above a plurality of solder bump landing pads 104 above an active side 102 of a semiconductor die 100.

In an embodiment, insulative material stack 106 is composed of two insulative layers, 106A and 106B, as depicted in FIG. 1A. In one such embodiment, the insulative layers 106A and 106B are both photo-insensitive films. In another embodiment (not shown) insulative material stack 106 is composed of a single photo-insensitive dielectric layer. In an embodiment, insulative material stack 106 is formed by laminating or otherwise depositing one or more layers of dielectric materials. Since a lithography operation will not subsequently be used to pattern the insulative material stack 106, in an embodiment, one or more of the layers is photo-insensitive. In one embodiment, the insulative material stack 106 is composed of one or more layers of an inorganic dielectric material, such as a silicon nitride, silicon oxide, or silicon oxy-nitride layer. In one embodiment, the insulative material stack 106 is composed of one or more layers of an organic dielectric material such as a polyimide layer. In an embodiment, the insulative material stack 106 is composed of two dielectric layers, each having a thickness of approximately 40 microns. In an embodiment, the insulative material stack 106 is formed using a technique such as, but not limited to, lamination, paste printing, or spin coating. In an embodiment, one layer of the dielectric stack 106 has a filler content over approximately 60% to reduce its thermal expansion coefficient. In an embodiment, the dielectric layers of the stack 106 have very different chemical properties and selectivity under etching or solvent dissolving.

The semiconductor die 100 may be formed from a semiconductor substrate, such as a single crystalline silicon substrate. Other materials, such as, but not limited to, group III-V material and germanium or silicon germanium material substrates may also be considered. The active side 102 of the semiconductor die 100 may be the side upon which semiconductor devices are formed. In an embodiment, the active side 102 of the semiconductor die 100 includes a plurality of semiconductor devices, such as but not limited to transistors, capacitors and resistors interconnected together by a die interconnection structure into functional circuits to thereby form an integrated circuit. As will be understood to those skilled in the art, the device side of the semiconductor die includes an active portion with integrated circuitry and interconnections. The semiconductor die may be any appropriate integrated circuit device including but not limited to a microprocessor (single or multi-core), a memory device, a chipset, a graphics device, an application specific integrated circuit according to several different embodiments. In an embodiment, solder bump landing pads 104 are composed of a metal region suitable for electrically interconnecting interconnects of a semiconductor die with routing layers of a package. In one embodiment, solder bump landing pads 104 are composed of copper.

In an embodiment, the laser ablation process described below is sensitive to delicate features of the active side 102 of the semiconductor die 100. For example, in one embodiment, the plurality of solder bump landing pads 104 is formed above a low-k dielectric layer of the active side 102 of the semiconductor die 100. The low-k dielectric layer is a layer with a dielectric constant less than 4, as is otherwise observed for silicon dioxide. In a specific embodiment embodiment, low-k dielectric layer is formed by a chemical vapor deposition process involving silane or an organosilane as a precursor gas. In another specific embodiment, the low-k dielectric layer is composed of a material having a dielectric constant in the range of 2.5 to less than 4. In a particular embodiment, the low-k dielectric layer is composed of a material such as, but not limited to, a silicate or a carbon-doped oxide with 0-10% porosity.

Figure 1B:
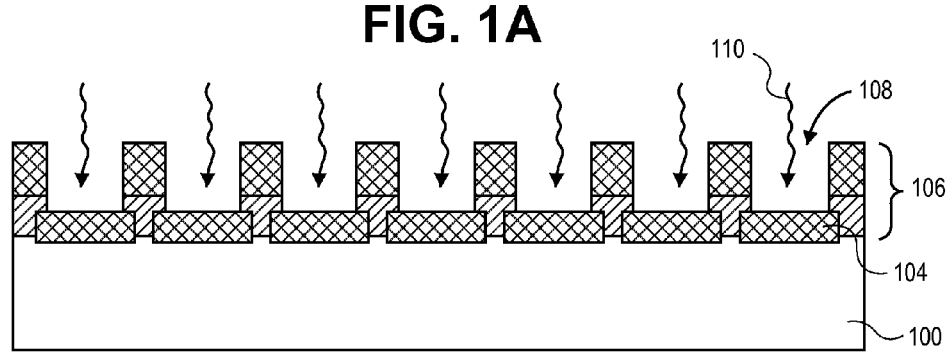
FIG. 1B illustrates a cross-sectional view representing an operation including forming, by laser ablation, a plurality of trenches in the insulative material stack of FIG. 1A to expose a corresponding portion of each of the plurality of solder bump landing pads in a method of fabricating a semiconductor structure, in accordance with an embodiment of the present invention.

Referring to FIG. 1B, a plurality of trenches 108 is formed by a laser ablation process 110 in the insulative material stack to expose a corresponding portion of each of the plurality of solder bump landing pads 104.

In an embodiment, the plurality of trenches 108 is formed at a pitch of, or less than, approximately 90 microns. In one such embodiment, the patterning is scalable to, e.g., a 30 micron package pitch. In an embodiment, forming the plurality of trenches 108 by the laser ablation process 110 includes using an excimer laser. An excimer laser (also known as an exciplex laser) is a form of ultraviolet laser. The term excimer is short for "excited dimer," while exciplex is short for "excited complex." Most excimer lasers are of the noble gas halide type, for which the term excimer is strictly speaking a misnomer (e.g., since a dimer refers to a molecule of two identical or similar parts). An excimer laser typically uses a combination of a noble gas (argon, krypton, or xenon) and a reactive gas (fluorine or chlorine). Under the appropriate conditions of electrical stimulation and high pressure, a pseudo-molecule called an excimer (or in the case of noble gas halides, exciplex) is created, which may only exist in an energized state and can give rise to laser light in the ultraviolet range. Laser action in an excimer molecule occurs since it has a bound (associative) excited state, but a repulsive (dissociative) ground state. This is because noble gases such as xenon and krypton are highly inert and do not usually form chemical compounds. However, when in an excited state (e.g., induced by an electrical discharge or high-energy electron beams, which produce high energy pulses), they can form temporarily-bound molecules with themselves (dimers) or with halogens (complexes) such as fluorine and chlorine. The excited compound may give up its excess energy by undergoing spontaneous or stimulated emission, resulting in a strongly repulsive ground state molecule which very quickly dissociates back into two unbound atoms, e.g., on the order of a pico-second. This may form a population inversion.

Thus, in an embodiment, forming the plurality of trenches 108 by laser ablation includes using a pico-second based laser. However, in another embodiment, a femto-second based laser is used. Using the latter may lead to less damage of peripheral structures than a pico-second based laser. In either case, in an embodiment, throughput for the laser ablation operation is approximately in the range of 5-10 wafers per hour.

Figure 1C:
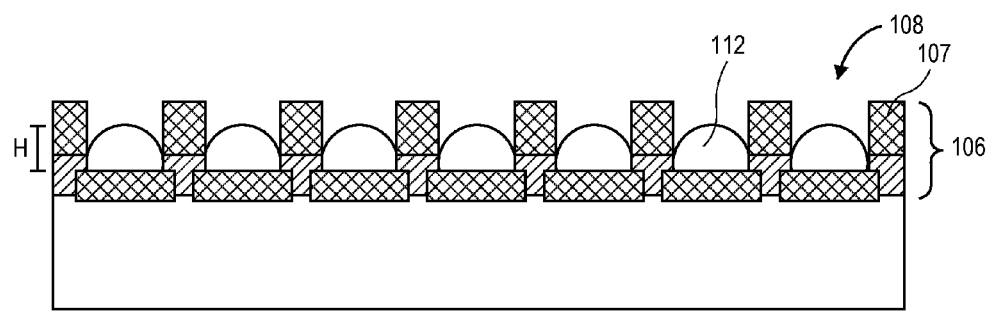
FIG. 1C illustrates a cross-sectional view representing an operation including forming a solder bump in each of the plurality of trenches of FIG. 1B in a method of fabricating a semiconductor structure, in accordance with an embodiment of the present invention.

Referring to FIG. 1C, a solder bump 112 is formed in each of the plurality of trenches 108.

In an embodiment, the solder bumps 112 are formed as being defined by the trenches 108 in size, shape and/or height of the solder bumps 112. In an embodiment, forming the solder bumps 112 includes forming each bump to a height (H) lower than the top surface 107 of the insulative material stack 106. The solder bumps 112 may be composed of copper and may be formed by first solder paste printing on solder bump landing pads 104 followed by a metal reflow operation.

Figure 1D:
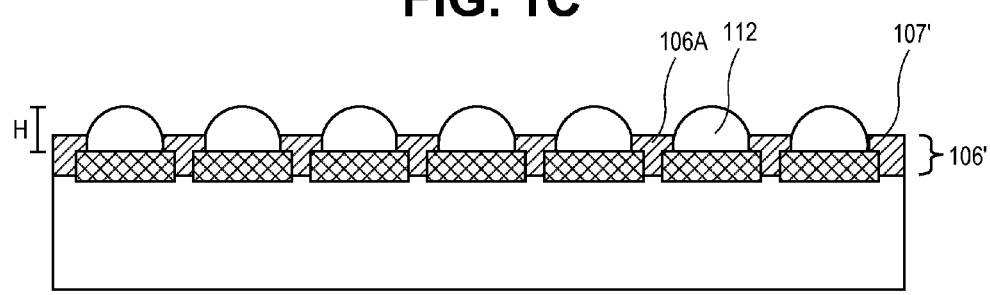
FIG. 1D illustrates a cross-sectional view representing an operation including removing a portion of the insulative material stack of FIG. 1C in a method of fabricating a semiconductor structure, in accordance with an embodiment of the present invention.

Referring to FIG. 1D, a portion of the insulative material stack 106 is removed to provide a reduced insulative material stack 106'.

In an embodiment, insulative material stack 106 is composed of two insulative layers 106A and 106B, as depicted in FIG. 1A, and removing the portion of the insulative material stack 106 includes removing layer 6B, e.g., which may be a second photo-insensitive dielectric layer. In another embodiment (not shown), however, the insulative material stack 106 is composed of a single photo-insensitive dielectric layer, and removing the portion of the insulative material stack 106 includes removing a portion of the single photo-insensitive dielectric layer. In either case, in an embodiment, the portion of the insulative material stack 106 is removed by stripping with a wet chemical etchant. In an embodiment, the portion of the insulative material stack 106 is removed by a process such as, but not limited to, dry or wet chemical etching, stripping, or dissolving.

Referring again to FIG. 1D, removing the portion of the insulative material stack 106 includes forming a new top surface 107' of the reduced insulative material stack 106'. In one such embodiment, the new top surface 107' of the reduced insulative material stack 106' is below the height (H) of each solder bump 112, as depicted in FIG. 1D. Thus, in an embodiment, the solder height (H) is engineered with the thickness and dimensions of the trenches 108.

In reference again to FIG. 1D, in accordance with an embodiment of the present invention, a semiconductor structure is fabricated to ultimately include a photo-insensitive solder mask since laser ablation is used instead of lithography to pattern the solder mask. For example, in an embodiment, a semiconductor structure includes a semiconductor die having an active side. A photo-insensitive solder mask is disposed on the active side of the semiconductor die. The photo-insensitive solder mask includes a plurality of trenches exposing a corresponding portion of each of a plurality of solder bump landing pads. A solder bump is disposed in each of the plurality of trenches. In an embodiment, the photo-insensitive solder mask is composed of an organic matrix with inorganic fillers.

In one such embodiment, the photo-insensitive solder mask is composed of a material such as, but not limited to, an inorganic dielectric material or an organic dielectric material. In another such embodiment, the plurality of solder bump landing pads is formed above a low-k dielectric layer of the active side of the semiconductor die. In another such embodiment, the plurality of trenches has a pitch of, or less than, approximately 90 microns.

In another aspect, a packaged semiconductor die formed by methods described above may be housed in a variety of packaging options. One such option is housing such a semiconductor die in a coreless substrate formed by a bumpless build-up layer BBUL process. For example, FIG. 2 illustrates a cross-sectional view of a packaged semiconductor die, in accordance with an embodiment of the present invention.

Figure 2:
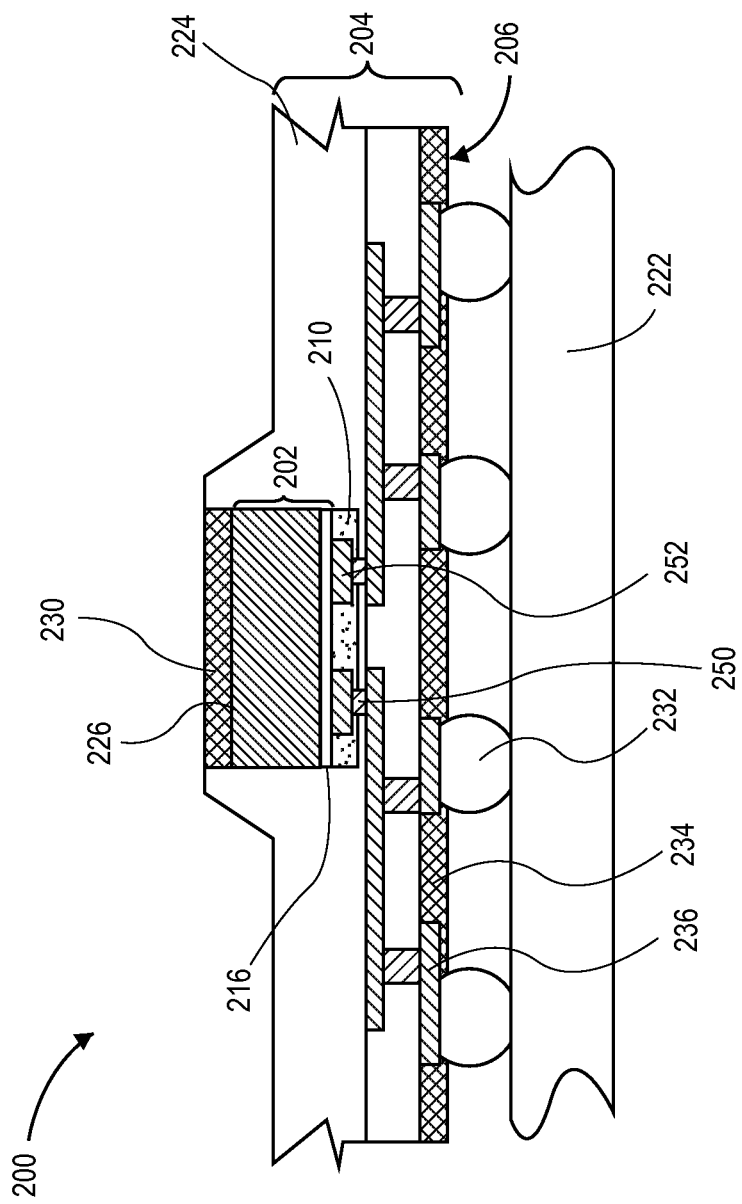
FIG. 2 illustrates a cross-sectional view of a packaged semiconductor die, in accordance with an embodiment of the present invention.

Referring to FIG. 2, a semiconductor package 200 includes a substrate 204 having a land side 206. A semiconductor die 202 is embedded in the substrate 204. The semiconductor die 202 has an active side 216 proximate to the land side 206 of the substrate 204. The semiconductor die 202 also has a back side 226 distal from the land side 206 of the substrate 204. A photo-insensitive solder mask 210 is disposed on the active side 216 of the semiconductor die 202. The photo-insensitive solder mask 210 has solder bumps 250 and solder bump landing pads 252 disposed therein, only two pairs of which are depicted in FIG. 2 for clarity.

The semiconductor die 202 and active side 216 may be the same or similar to the semiconductor die 100 and active side 102 described above. The photo-insensitive solder mask 210 may be composed of a material the same as or similar to the materials described in association with layers 106, 1061, 106A or 106B described above. Solder bumps 250 and solder bump landing pads 252 may be the same or similar to the solder bumps 112 and solder bump landing pads 104 described above.

In an embodiment, the substrate 204 is a BBUL substrate, as depicted in FIG. 2. In one such embodiment, the substrate 204 is a coreless substrate, as is also depicted in FIG. 2. However, in another embodiment (not shown), a semiconductor die is housed in a core of a substrate. In another embodiment (not shown), a substrate includes a fan-out layer.

BBUL is a processor packaging technology that is bumpless since it does not use the usual small solder bumps to attach the silicon die to the processor package wires. It has build-up layers since it is grown or built-up around the silicon die. Some semiconductor packages now use a coreless substrate, which does not include the thick resin core layer commonly found in conventional substrates. In an embodiment, as part of the BBUL process, electrically conductive vias and routing layers are formed above the active side 216 of the semiconductor die 202 using a semi-additive process (SAP) to complete remaining layers. In an embodiment, an external contact layer is formed. In one embodiment, an array of external conductive contacts is a ball grid array (BGA). In other embodiments, the array of external conductive contacts is an array such as, but not limited to, a land grid array (LGA) or an array of pins (PGA).

In an embodiment, substrate 204 is a coreless substrate since a panel is used to support packaging of semiconductor die 202 through to formation of an array of external conductive conducts. The panel is then removed to provide a coreless package for the semiconductor die. Accordingly, in an embodiment, the term "coreless" is used to mean that the support upon which the package was formed for housing a die is ultimately removed at the end of a build-up process. In a specific embodiment, a coreless substrate is one that does not include a thick core after completion of the fabrication process. As an example, a thick core may be one composed of a reinforced material such as is used in a motherboard and may include conductive vias therein. It is to be understood that die-bonding film may be retained or may be removed. In either case, inclusion or exclusion of a die-bonding film following removal of the panel provides a coreless substrate. Still further, the substrate may be considered a coreless substrate because it does not include a thick core such as a fiber reinforced glass epoxy resin.

The packaged semiconductor die 202 may, in an embodiment, be a fully embedded and surrounded semiconductor die. As used in this disclosure, "fully embedded and surrounded" means that all surfaces of the semiconductor die are in contact with an encapsulating film (such as a dielectric layer) of substrate, or at least in contact with a material housed within the encapsulating film. Said another way, "fully embedded and surrounded" means that all exposed surfaces of the semiconductor die are in contact with the encapsulating film of a substrate.

The packaged semiconductor die 202 may, in an embodiment, be a fully embedded semiconductor die. As used in this disclosure, "fully embedded" means that an active side and the entire sidewalls of the semiconductor die are in contact with an encapsulating film (such as a dielectric layer) of a substrate, or at least in contact with a material housed within the encapsulating film. Said another way, "fully embedded" means that all exposed regions of an active side and the exposed portions of the entire sidewalls of the semiconductor die are in contact with the encapsulating film of a substrate. However, in such cases, the semiconductor die is not "surrounded" since the backside of the semiconductor die is not in contact with an encapsulating film of the substrate or with a material housed within the encapsulating film. In a first embodiment, a back surface of the semiconductor die protrudes from the global planarity surface of the die side of a substrate. In a second embodiment, no surface of the semiconductor die protrudes from the global planarity surface of the die side of a substrate.

In contrast to the above definitions of "fully embedded and surrounded" and "fully embedded," a "partially embedded" die is a die having an entire surface, but only a portion of the sidewalls, in contact with an encapsulating film of a substrate (such as a coreless substrate), or at least in contact with a material housed within the encapsulating film. In further contrast, a "non-embedded" die is a die having at most one surface, and no portion of the sidewalls, in contact with an encapsulating film of a substrate (such as a coreless substrate), or in contact with a material housed within the encapsulating film.

Referring again to FIG. 2, in an embodiment, a die-bonding film 230 (also known as a die-attach film) is disposed on the backside 226 of the semiconductor die 202. In an embodiment, the substrate 204 includes an encapsulant layer 224. In an embodiment, as depicted in FIG. 2, package 200 includes a foundation substrate 222 at the land side 206 of the substrate 204. For example, where the semiconductor die 202 is part of a hand-held device such as a smart phone embodiment or a hand-held reader embodiment, the foundation substrate 222 is a motherboard. In another exemplary embodiment, where the semiconductor die 202 is part of a hand-held device such as a smart phone embodiment or a hand-held reader embodiment, the foundation substrate 222 is an external shell such as the portion an individual touches during use. In another exemplary embodiment, where the semiconductor die 202 is part of a hand-held device such as a smart phone embodiment or a hand-held reader embodiment, the foundation substrate 222 includes both the motherboard and an external shell such as the portion an individual touches during use.

An array of external conductive contacts 232 may be disposed on the land side 206 of the substrate 204. In an embodiment, the external conductive contacts 232 couple the substrate 204 to the foundation substrate 222. The external conductive contacts 232 may be used for electrical communication with the foundation substrate 222. In one embodiment, the array of external conductive contacts 232 is a ball grid array (BGA). A solder mask 234 may constitute the material that forms the land side 206 of the substrate 204. The external conductive contacts 232 are disposed upon bump bond pads 236.

As mentioned briefly above, a semiconductor die may be packaged on a panel. For example, a panel may be provided having a plurality of cavities disposed therein, each sized to receive a semiconductor die. During processing, identical structures may be mated in order to build a back-to-back apparatus for processing utility. Consequently, processing throughput is effectively doubled. The structure may form part of a larger panel with a plurality of identical regions having a similar or the same cross-section.

For example, a panel may include 1000 recesses on either side, allowing for fabrication of 2000 individual packages from a single panel. The panel may include an adhesion release layer and an adhesive binder. A cutting zone may be provided at each end of an individual apparatus for separation processing. A backside of a semiconductor die may be bonded to the panel with a die-bonding film. Encapsulating layers may be formed by a lamination process. In another embodiment, one or more encapsulation layers may be formed by spinning on and curing a dielectric upon a wafer-scale array of apparatuses.

In an embodiment, one or more of the above described semiconductor packages housing a semiconductor die is paired with other packages following the packaging process, e.g., the coupling of a packaged memory die with a package logic die. In an example, connections between two or more individually packaged die may be made post BBUL fabrication by using thermal compression bonding (TCB) processing. In another embodiment, more than one die is embedded in the same package. For example, in one embodiment, a packaged semiconductor die further includes a secondary stacked die. The first die may have one or more through-silicon vias disposed therein (TSV die). The second die may be electrically coupled to the TSV die through the one or more through-silicon vias. The apparatus may also include a coreless substrate. In one embodiment, both die are embedded in the coreless substrate.

Figure 3:
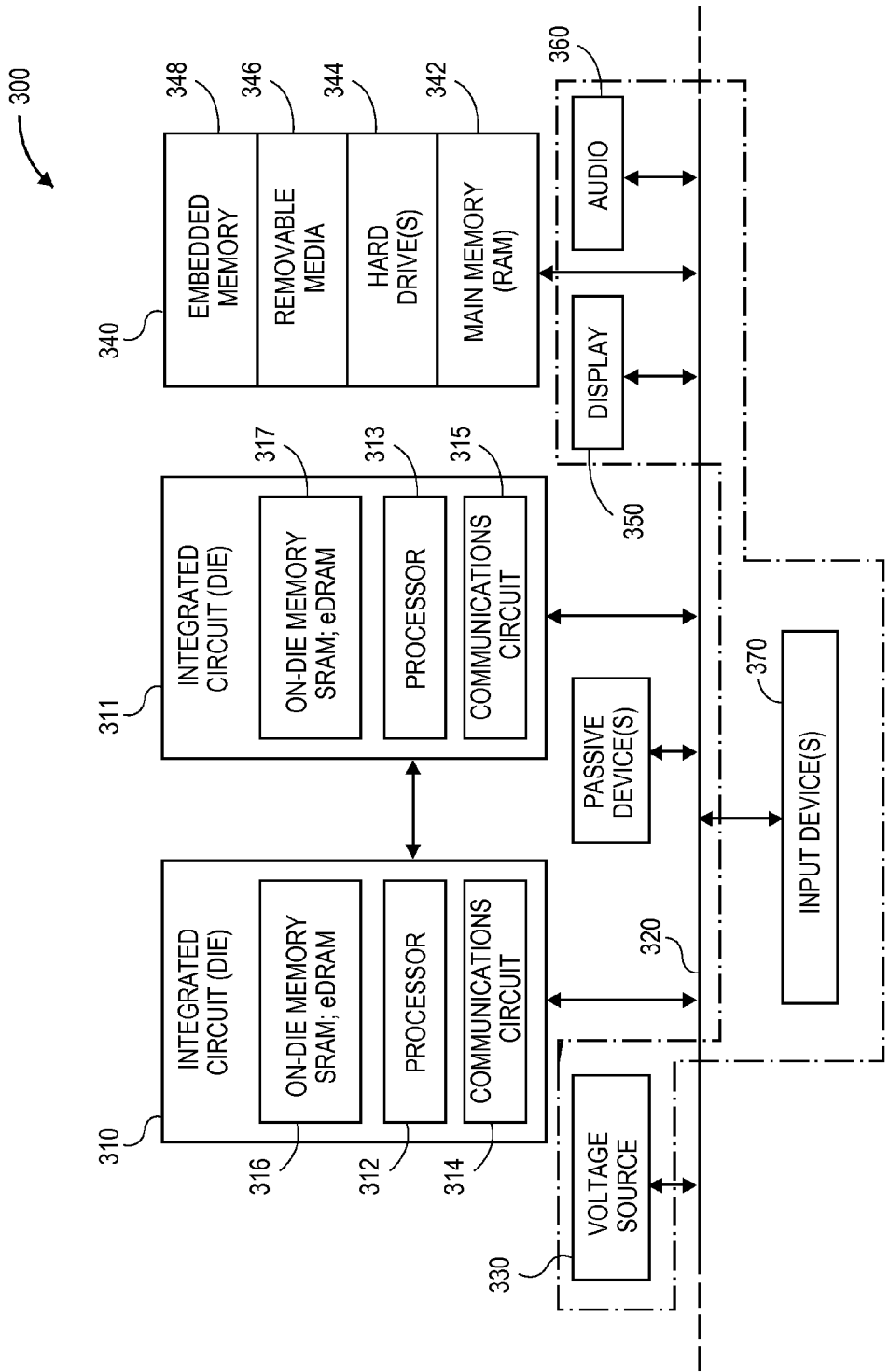
FIG. 3 is a schematic of a computer system, in accordance with an embodiment of the present invention.

FIG. 3 is a schematic of a computer system 300, in accordance with an embodiment of the present invention. The computer system 300 (also referred to as the electronic system 300) as depicted can embody a semiconductor structure or package formed by using laser ablation in a DISC formation process according to any of the several disclosed embodiments and their equivalents as set forth in this disclosure. The computer system 300 may be a mobile device such as a netbook computer. The computer system 300 may be a mobile device such as a wireless smart phone. The computer system 300 may be a desktop computer. The computer system 300 may be a hand-held reader.

In an embodiment, the electronic system 300 is a computer system that includes a system bus 320 to electrically couple the various components of the electronic system 300. The system bus 320 is a single bus or any combination of busses according to various embodiments. The electronic system 300 includes a voltage source 330 that provides power to the integrated circuit 310. In some embodiments, the voltage source 330 supplies current to the integrated circuit 310 through the system bus 320.

The integrated circuit 310 is electrically coupled to the system bus 320 and includes any circuit, or combination of circuits according to an embodiment. In an embodiment, the integrated circuit 310 includes a processor 312 that can be of any type. As used herein, the processor 312 may mean any type of circuit such as, but not limited to, a microprocessor, a microcontroller, a graphics processor, a digital signal processor, or another processor. In an embodiment, the processor 312 is a semiconductor structure or package formed by using laser ablation in a DISC formation process disclosed herein. In an embodiment, SRAM embodiments are found in memory caches of the processor. Other types of circuits that can be included in the integrated circuit 310 are a custom circuit or an application-specific integrated circuit (ASIC), such as a communications circuit 314 for use in wireless devices such as cellular telephones, smart phones, pagers, portable computers, two-way radios, and similar electronic systems. In an embodiment, the processor 310 includes on-die memory 316 such as static random-access memory (SRAM). In an embodiment, the processor 310 includes embedded on-die memory 316 such as embedded dynamic random-access memory (eDRAM).

In an embodiment, the integrated circuit 310 is complemented with a subsequent integrated circuit 311. Useful embodiments include a dual processor 313 and a dual communications circuit 315 and dual on-die memory 317 such as SRAM. In an embodiment, the dual integrated circuit 310 includes embedded on-die memory 317 such as eDRAM.

In an embodiment, the electronic system 300 also includes an external memory 340 that in turn may include one or more memory elements suitable to the particular application, such as a main memory 342 in the form of RAM, one or more hard drives 344, and/or one or more drives that handle removable media 346, such as diskettes, compact disks (CDs), digital variable disks (DVDs), flash memory drives, and other removable media known in the art. The external memory 340 may also be embedded memory 348 such as the first die in an embedded TSV die stack, according to an embodiment.

In an embodiment, the electronic system 300 also includes a display device 350, an audio output 360. In an embodiment, the electronic system 300 includes an input device such as a controller 370 that may be a keyboard, mouse, trackball, game controller, microphone, voice-recognition device, or any other input device that inputs information into the electronic system 300. In an embodiment, an input device 370 is a camera. In an embodiment, an input device 370 is a digital sound recorder. In an embodiment, an input device 370 is a camera and a digital sound recorder.

As shown herein, the integrated circuit 310 can be implemented in a number of different embodiments, including a semiconductor structure or package formed by using laser ablation in a DISC formation process according to any of the several disclosed embodiments and their equivalents, an electronic system, a computer system, one or more methods of fabricating an integrated circuit, and one or more methods of fabricating an electronic assembly that includes a semiconductor structure or package formed by using laser ablation in a DISC formation process according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor structure or package formed by using laser ablation in a DISC formation process embodiments and their equivalents.

Thus, DISC formation with laser ablation and resulting semiconductor structures and packages have been disclosed. In an embodiment, a method of fabricating a semiconductor structure includes forming an insulative material stack above a plurality of solder bump landing pads. The solder bump landing pads are above an active side of a semiconductor die. A plurality of trenches is formed in the insulative material stack by laser ablation to expose a corresponding portion of each of the plurality of solder bump landing pads. A solder bump is formed in each of the plurality of trenches.

A portion of the insulative material stack is then removed. In one such embodiment, the plurality of trenches is formed at a pitch of, or less than, approximately 90 microns. In one such embodiment, the photo-insensitive solder mask is composed of an organic matrix with inorganic fillers.

What is claimed is:

1. A semiconductor package, comprising:
    a substrate having a land side, wherein the substrate comprises a fan-out layer, and wherein the substrate is a bumpless build-up layer (BBUL) substrate; and
    a semiconductor die fully embedded and surrounded by an encapsulating film of the BBUL substrate, the semiconductor die comprising:
        an active side proximate to the land side of the substrate;
        a photo-insensitive solder mask disposed on the active side of the semiconductor die, between the semiconductor die and the substrate, the photo-insensitive solder mask comprising a plurality of trenches exposing a corresponding portion of each of a plurality of solder bump landing pads, wherein the photo-insensitive solder mask is distinct from the encapsulating film and does not extend beyond the active side of the semiconductor die; and
        a solder bump disposed in each of the plurality of trenches.

2. The semiconductor package of claim 1, wherein the substrate is a coreless substrate.

3. The semiconductor package of claim 1, wherein the semiconductor die is housed in a core of the substrate.

4. The semiconductor package of claim 1, wherein the photo-insensitive solder mask comprises a material selected from the group consisting of an inorganic dielectric material and an organic dielectric material.

5. The semiconductor package of claim 1, wherein the plurality of solder bump landing pads is formed above a low-k dielectric layer of the active side of the semiconductor die.

6. The semiconductor package of claim 1, wherein the plurality of trenches has a pitch of, or less than, approximately 90 microns.

7. A semiconductor package, comprising:
    a substrate having a land side, wherein the substrate is a bumpless build-up layer (BBUL) substrate; and
    a semiconductor die fully embedded and surrounded by an encapsulating film of the BBUL substrate, the semiconductor die comprising:
        an active side proximate to the land side of the substrate;
        a photo-insensitive solder mask disposed on the active side of the semiconductor die, between the semiconductor die and the substrate, the photo-insensitive solder mask comprising a plurality of trenches exposing a corresponding portion of each of a plurality of solder bump landing pads, wherein the photo-insensitive solder mask comprises a material selected from the group consisting of an inorganic dielectric material and an organic dielectric material, and wherein the photo-insensitive solder mask is distinct from the encapsulating film and does not extend beyond the active side of the semiconductor die; and
        a solder bump disposed in each of the plurality of trenches.

8. The semiconductor package of claim 7, wherein the substrate is a coreless substrate.

9. The semiconductor package of claim 7, wherein the semiconductor die is housed in a core of the substrate.

10. The semiconductor package of claim 7, wherein the plurality of solder bump landing pads is formed above a low-k dielectric layer of the active side of the semiconductor die.

11. The semiconductor package of claim 7, wherein the plurality of trenches has a pitch of, or less than, approximately 90 microns.

12. A semiconductor package, comprising:
    a substrate having a land side, wherein the substrate is a bumpless build-up layer (BBUL) substrate; and
    a semiconductor die fully embedded and surrounded by an encapsulating film of the BBUL substrate, the semiconductor die comprising:
        an active side proximate to the land side of the substrate;
        a photo-insensitive solder mask disposed on the active side of the semiconductor die, between the semiconductor die and the substrate, the photo-insensitive solder mask comprising a plurality of trenches exposing a corresponding portion of each of a plurality of solder bump landing pads, wherein the plurality of solder bump landing pads is formed above a low-k dielectric layer of the active side of the semiconductor die, and wherein the photo-insensitive solder mask is distinct from the encapsulating film and does not extend beyond the active side of the semiconductor die; and
        a solder bump disposed in each of the plurality of trenches.

13. The semiconductor package of claim 12, wherein the substrate is a coreless substrate.

14. The semiconductor package of claim 12, wherein the semiconductor die is housed in a core of the substrate.

15. The semiconductor package of claim 12, wherein the plurality of trenches has a pitch of, or less than, approximately 90 microns.

16. A semiconductor package, comprising:
    a substrate having a land side, wherein the substrate is a bumpless build-up layer (BBUL) substrate; and
    a semiconductor die fully embedded and surrounded by an encapsulating film of the BBUL substrate, the semiconductor die comprising:
        an active side proximate to the land side of the substrate;
        a photo-insensitive solder mask disposed on the active side of the semiconductor die, between the semiconductor die and the substrate, the photo-insensitive solder mask comprising a plurality of trenches exposing a corresponding portion of each of a plurality of solder bump landing pads, wherein the photo-insensitive solder mask is distinct from the encapsulating film and does not extend beyond the active side of the semiconductor die; and
        a solder bump disposed in each of the plurality of trenches, wherein the plurality of trenches has a pitch of, or less than, approximately 90 microns.

17. The semiconductor package of claim 16, wherein the substrate is a coreless substrate.

18. The semiconductor package of claim 16, wherein the semiconductor die is housed in a core of the substrate.

* * * * *